United States Patent
Merrigan

(10) Patent No.: US 7,158,772 B1
(45) Date of Patent: Jan. 2, 2007

(54) FILTER FOR BROADCAST RECEIVER TUNER

(75) Inventor: Brian Merrigan, Manchester (GB)

(73) Assignee: LSI Logic Corporation, Milpitas, CA (US)

( * ) Notice: Subject to any disclaimer, the term of this patent is extended or adjusted under 35 U.S.C. 154(b) by 983 days.

(21) Appl. No.: 10/051,445

(22) Filed: Jan. 18, 2002

(51) Int. Cl.
  *H04B 1/10* (2006.01)
  *H04B 17/02* (2006.01)
  *H04B 1/26* (2006.01)

(52) U.S. Cl. .................. 455/307; 455/136; 455/323; 327/52; 327/552; 330/252; 330/305

(58) Field of Classification Search ............ 455/307, 455/179.1, 306, 318, 323, 334, 333, 339, 455/341, 343.1, 130, 136, 226.1, 232.1; 327/103, 327/552, 553, 341
See application file for complete search history.

(56) References Cited

U.S. PATENT DOCUMENTS

| | | | | |
|---|---|---|---|---|
| 4,320,345 A | * | 3/1982 | Waggener | 329/307 |
| 6,031,878 A | * | 2/2000 | Tomasz et al. | 375/316 |
| 6,069,522 A | * | 5/2000 | Venkatraman et al. | 327/552 |
| 6,112,125 A | * | 8/2000 | Sandusky | 700/28 |
| 6,239,653 B1 | * | 5/2001 | Rezzi et al. | 327/552 |
| 6,677,822 B1 | * | 1/2004 | Hasegawa | 330/258 |

\* cited by examiner

*Primary Examiner*—Tony T. Nguyen
(74) *Attorney, Agent, or Firm*—Christopher P Maiorana PC

(57) ABSTRACT

A Gaussian family filter (e.g. an equiripple filter) comprises a first pole, a second pole, a third pole and a signal combiner. The first pole has a biquadratic low pass characteristic and is configured to provide a first low pass signal. The second pole is coupled to the first low pass signal, the second pole having a first-order low pass characteristic, and providing a second low pass signal and a high pass signal. The third pole is coupled to the second low pass signal and has a biquadratic low pass characteristic for generating a third low pass signal. The signal combiner is configured to combine the third low pass signal and the high pass signal to provide a combined signal.

16 Claims, 4 Drawing Sheets

FILTER FOR BROADCAST RECEIVER TUNER

FIELD OF THE INVENTION

The present invention relates to a filter for use in a tuner for a broadcast receiver. In one form, it relates to a low-pass filter of the Gaussian family (e.g. a Gaussian response filter, or a Bessel filter, or an equiripple (or "equal ripple") filter). The invention is especially, but not exclusively, suitable for use in a satellite receiver tuner. The invention is also especially, but not exclusively, suitable for implementation within an integrated circuit.

BACKGROUND TO THE INVENTION

An example of a conventional satellite tuner is described in U.S. Pat. No. 6,031,878. The tuner includes a downconverter for directly converting a received satellite signal to a baseband, to tune to the signal converted to the baseband. Active filters provide a low pass function to reject adjacent channels above the baseband. The filtered signal is fed to a conventional set-top box for processing at the baseband.

Desirable properties of the filter are that it should have a substantially constant group delay (i.e., a constant phase delay characteristic) across at least its pass band, and it should have a steep roll-off (attenuation curve) above its passband. A constant group delay is desired to avoid distortion of pulse shapes and of phase-encoded information. A sharp roll-off is desired in order to ensure rejection of an adjacent higher channel just above the passband. For example, a channel may typically occupy a bandwidth of 30 MHz, and adjacent channels may have their centres at a 40 MHz spacing, leaving only a gap of 10 MHz between adjacent channels. Therefore, the filter should have a flat passband, and a steep roll-off to attenuate the next channel.

By way of example, FIGS. 1 and 2 compare the group delay and the magnitude response for three known filters, a Butterworth filter (curves 10), a Gaussian Response Filter (curves 12) and an Equiripple filter (curves 14). For further information about such filter types, reference may be made to the "Handbook of Filter Synthesis" by Anatol I. Zverev, John Wiley and Sons, 1967.

As can be seen in FIG. 1, the Butterworth filter 10 exhibits significant peaking in its group delay characteristics in the passband, at the cut-off frequency 16. This reduces the phase linearity of the filter. The Gaussian response filter 12 and equiripple filter 14 have a much more desirable flatter group delay, which extends to above the −3 dB frequency 16 for the filter. Gaussian response and equiripple filters are examples of Gaussian family filters, namely a filter which has a substantially flat group delay characteristic up to at least the cut-off frequency of the filter.

However, as can be seen in FIG. 2, a trade-off for the flatter group delay characteristic of the Gaussian response filter 12 and the equiripple filter 14 is that they have a relatively poor roll-off characteristic above the passband. The roll-off characteristics for the Butterworth filter 10 is much steeper, leading to better rejection of an unwanted adjacent channel. For an equiripple filter, the attenuation from the −3 dB frequency to twice this frequency is about 11 dB, which is relatively poor for rejecting an adjacent signal channel. Therefore, it would be desirable to improve the roll-off characteristics of a Gaussian family filter to make such devices more suitable for satellite tuner applications.

In a different field, equiripple filters have found large-scale use in read-channel (data retrieval) integrated circuits, for use in hard disk drives, magneto-optical disc drives, and DVD optical storage systems. The equiripple filter is modified to include high frequency boost, in order to correct the relative amplitude of high frequency signals which tend to be attenuated during the data read operation. By controlling the level of high frequency boost, the attenuated high frequency signals can be restored to the same amplitude as the low frequency signals. Referring to FIG. 3, a conventional filter 20 is a $7^{th}$ order filter, consisting of an initial $1^{st}$ order real axis low pass pole (stage) 22, and three $2^{nd}$ order biquadratic poles 24 characteristic of equiripple filters, each pole having a different and independent −3 dB frequency from the other poles. The high frequency boost is provided by a parallel boost (high pass) path 26 from the $1^{st}$ order pole 22 to a summing stage 28 downstream of the first of the $2^{nd}$ order poles 24. The characteristics of this type of filter for use in a data read-channel are well known and documented (for example, Arthur B. Williams and Fred J. Taylor, "Electronic Filter Design Handbook", McGraw-Hill, 1988).

However, such a high-frequency boosted filter 20 in which all of the input high frequency is boosted by the boost path 26 is only suitable for signals which contain relatively little high frequency content compared to the signal of interest. If the input signal contains significant high frequency content, then that content could overload the boost path 26 and the summing stage 28, causing signal distortion. It would of course be possible to decrease the input amplitude of the signal, but it is generally desired that the input amplitude should be as high as possible for optimum signal-to-noise ratio. Such a decreased input amplitude would also require post-amplification to restore the signal amplitude to a conventional level for other circuits.

FIGS. 4 and 5 show the respective information content in a data read signal 30 from a pick up of a conventional data retrieval device, and a signal 32 from a down converter of a conventional satellite tuner. The data read signal 30 includes a desired frequency band 34 (with attenuated high frequencies to be corrected) and a band of relatively low amplitude high frequency noise 36 to be rejected. In this signal, there is relatively little high frequency information, and the desired frequency band 34 forms the majority of the signal 32, making this a signal for which the filter 20 is suitable (as explained above). In contrast, the down-converted satellite signal 32 includes the desired channel 38, and one or more undesired adjacent higher channels 40 to be rejected. Therefore, this signal 32 includes significant high frequency information (40) of equal amplitude to the desired channel 38, making this a signal for which the filter 20 is generally unsuitable.

Moreover, in the circuit of FIG. 3, the high frequency boost path 26 is provided only for the purposes of equalising the level of high frequencies in the data read signal. Satellite signals do not include such a loss of high frequencies, and so there is no logical use of a high frequency boost path for satellite signals. The use of the same high frequency boost to boost the amplitude of high frequencies in satellite signals would in fact cause amplitude non-linearity in the desired passband. Moreover, high frequency boost is also counter-intuitive in a filter for rejecting an adjacent higher frequency channel which may be close in frequency to the desired channel, and which may have approximately the same amplitude as the desired channel.

SUMMARY OF THE INVENTION

The present invention concerns a Gaussian family filter generally comprising a first pole, a second pole, a third pole and a signal combiner. The first pole has a biquadratic low pass characteristic and is configured to provide a first low pass signal. The second pole is coupled to the first low pass signal, the second pole having a first-order low pass characteristic, and providing a second low pass signal and a high pass signal. The third pole is coupled to the second low pass signal and has a biquadratic low pass characteristic for generating a third low pass signal. The signal combiner is configured to combine the third low pass signal and the high pass signal to provide a combined signal.

The objects features and advantages of the invention include: (i) the provision of a substantially flat magnitude response in the pass band, and a steeper roll-off characteristic above the pass band, both resulting from a high frequency pass path; and/or (ii) reduced risk of signal overload by the high-frequency pass function.

BRIEF DESCRIPTION OF THE DRAWINGS

These and other features, advantages and objects of the invention will become apparent from the following non-limiting description of a preferred embodiment of the invention, and the appended claims and drawings, in which:

DETAILED DESCRIPTION OF THE PREFERRED EMBODIMENTS

Figure 6:
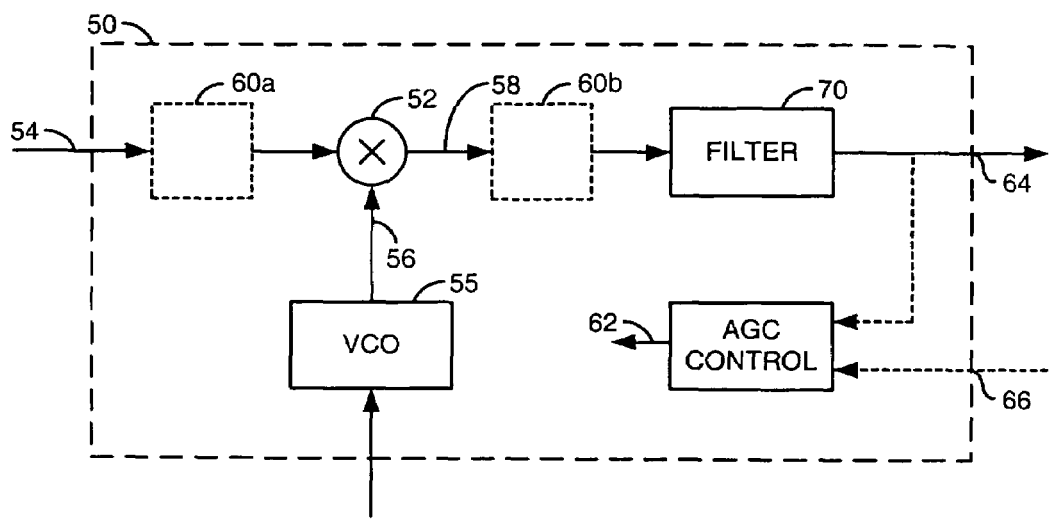
FIG. 6 is a schematic block diagram of an embodiment of the invention in the form of a satellite tuner.
Figure 7:
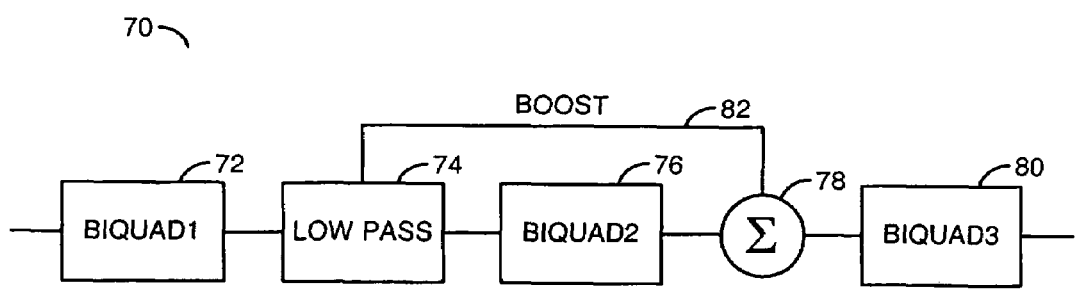
FIG. 7 is a schematic block diagram of the equiripple filter block in FIG. 6.

Referring to FIG. 6, an integrated circuit 50 includes circuit elements for forming a down-converter for use as a tuner for a satellite broadcast receiver. The principles of such a circuit are well known in the art and details may be found, for example, in the aforementioned U.S. Pat. No. 6,031,878. It will be appreciated that the integrated circuit 50 includes two channels for quadrature processing of the received signal. Only one channel is illustrated in FIG. 7 in order not to obscure the drawing.

Figure 5:
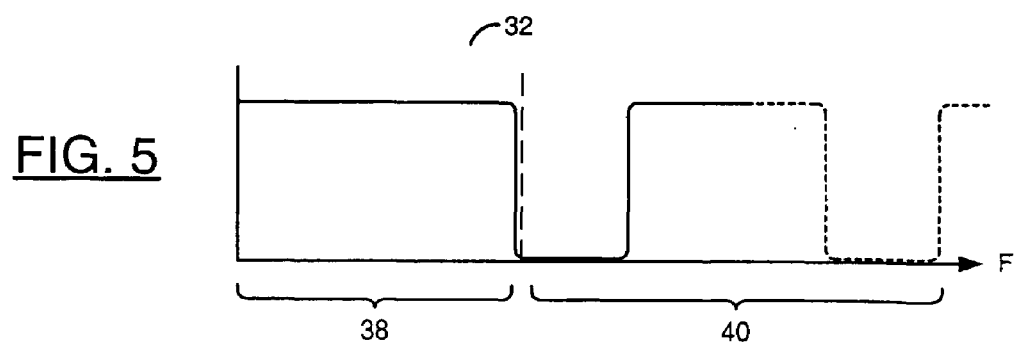
FIG. 5 is a schematic graph showing the spectral content of a conventional down-converted satellite signal.

The integrated circuit 50 includes a mixer 52 having a RF input 54 for receiving an RF signal from, for example, an antenna (not shown). The mixer 52 also receives a tuning input signal 56 from an internal voltage controlled oscillator (VCO) 55, and functions to down-convert the RF signal to a baseband according to the frequency of the tuning signal 56. The output signal 58 from the mixer 52 comprises the desired channel at the baseband, and a small number of adjacent higher channels similarly down-converted, but outputted at correspondingly higher frequencies (as in FIG. 5). The signal 58 has a bandwidth of about 400 MHz.

The integrated circuit 50 also includes one or more Automatic Gain Control (AGC) amplifiers 60 controlled by a control signal 62. An AGC amplifier might be provided at a position 60a upstream of the mixer, and/or at a position 60b downstream of the mixer. The control signal 62 may be generated internally (e.g. in accordance with the signal level at an output 64 of the integrated circuit), and/or the integrated circuit 50 may have a control input 66 for inputting an external signal.

Figure 8:
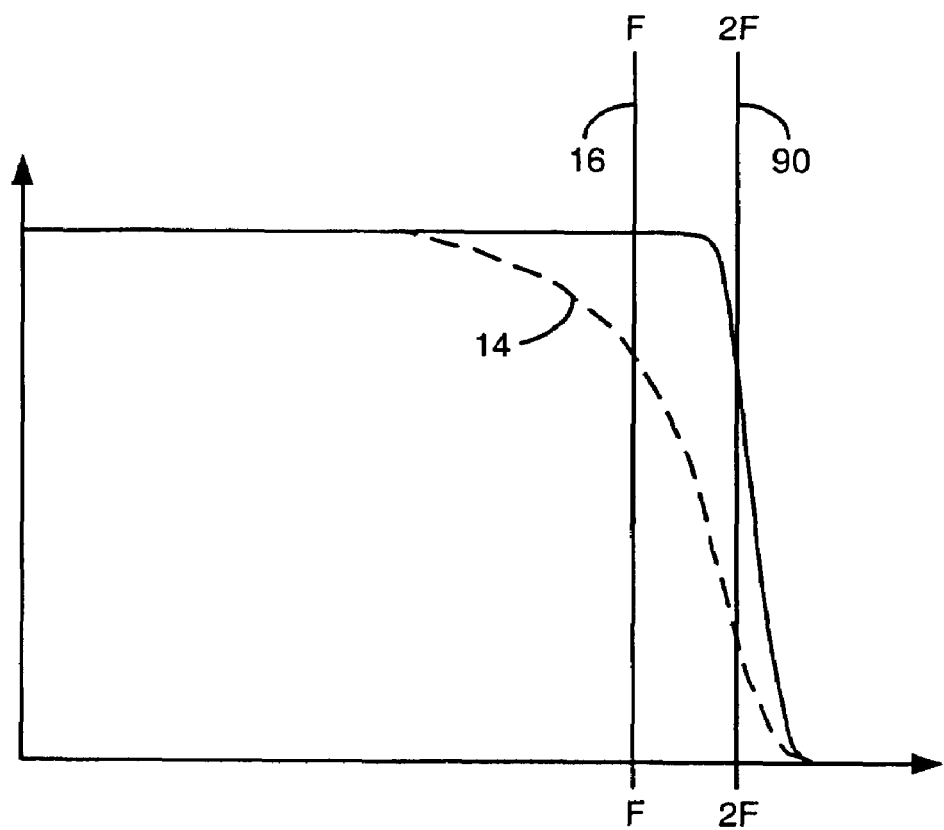
FIG. 8 is a schematic drawing showing the effect of high frequency boost of 3 dB on the magnitude response of the equiripple filter of FIG. 7 (horizontal axis-frequency (log); vertical axis-output level).

The output signal 58 from the mixer 52 is fed through a low pass filter 70 for filtering the unwanted high frequency content of the signal, in order to remove the unwanted channels adjacent to the desired channel. This avoids problems such as aliasing in downstream analog-to-digital converters which are typically used in downstream processing circuitry (not shown). Referring to FIG. 8, the low pass filter 70 is a $7^{th}$ order Gaussian family filter with high frequency boost. In this embodiment, the Gaussian family filter is an equiripple filter. However, as will be apparent from later description, the same principles may be applied to other Gaussian family filters.

In contrast to the conventional equiripple (boosted) data-read filter 20 shown in FIG. 3 (in which high frequency boost is used solely to provide emphasis of low amplitude high frequency signals), in the present embodiment, the high frequency boost is used to provide a steeper roll-off than the modest roll-off achievable with an equiripple filter without such boost (as already discussed with reference to FIG. 2). Instead of providing emphasis of high frequency signals, the level of high frequency boost is adapted in this embodiment to achieve a substantially flat magnitude response throughout the passband. Also, importantly, the high frequency boost path is configured to avoid an overload caused by the significant high frequency content of the signal 58.

The low pass filter 70 comprises in order a first pole 72, a second pole 74, a third pole 76, a summing stage 78, and a fourth pole 80. The first pole 72, third pole 76 and the fourth pole 80 are biquadratic second order poles characteristic of an equiripple filter. The second pole 74 is a first order pole, providing a high frequency output signal 82 corresponding to the frequency content rejected by the first order roll-off in the in-line low pass path. The high frequency output signal 82 is fed forward as a high frequency boost path signal to the summing stage 78. The pole positions of the first, third and fourth poles have are different from, and independent of, each other, the first pole 72 having the lowest pole position (e.g., the lowest cut off frequency), the third pole 76 having the middle pole position, and the fourth pole 80 having the highest pole position (e.g., the highest cut off frequency of the three biquadratics).

An important feature of this embodiment is that the first order (second) pole 74 which generates the high frequency boost signal 82 is downstream of at least one of the biquadratic poles. The high frequency content of the signal 58 is therefore filtered by the first biquadratic pole 72 before the high frequency boost signal 82 is generated. Even though the signal 58 contains a significant amount of high frequency content, a sufficient amount of the high frequency content is removed by the first biquadratic pole 72 to ensure that the summing stage 78 is not overloaded with the high frequency boost (or bypass) signal 82. The filter 70 is therefore able to accommodate relatively large amplitude signals, with less risk of distortion. In the preferred embodiment, the filter 70 is able to handle a signal amplitude of 1 volt peak-to-peak differential without high-pass overloading, whereas the equivalent circuit of FIG. 3 would only be able to handle a maximum satellite-signal amplitude of 0.25 volts peak-to-peak differential before high-pass overloading would occur. The larger amplitude capability in the present embodiment leads to a significantly improved signal-to-noise ratio.

In the preferred embodiment, the first pole 72 is the biquadratic having the lowest pole position, in order to remove as much of the unwanted high frequency content as possible. However, in other embodiments, different poles 76 or 80 may be used upstream of the first order low pass pole 74, provided that the upstream poles remove sufficient high frequency content to avoid overloading at the summing stage 78. Also, although the circuit includes one biquadratic pole 72 upstream of the high frequency boost path, and one biquadratic pole 80 downstream of the high frequency boost path, it will be appreciated that such positioning of the poles is not essential. For example, plural poles may be provided upstream of the high frequency boost path, and if desired possibly no poles may be provided downstream of the summing stage 78.

Figure 1:
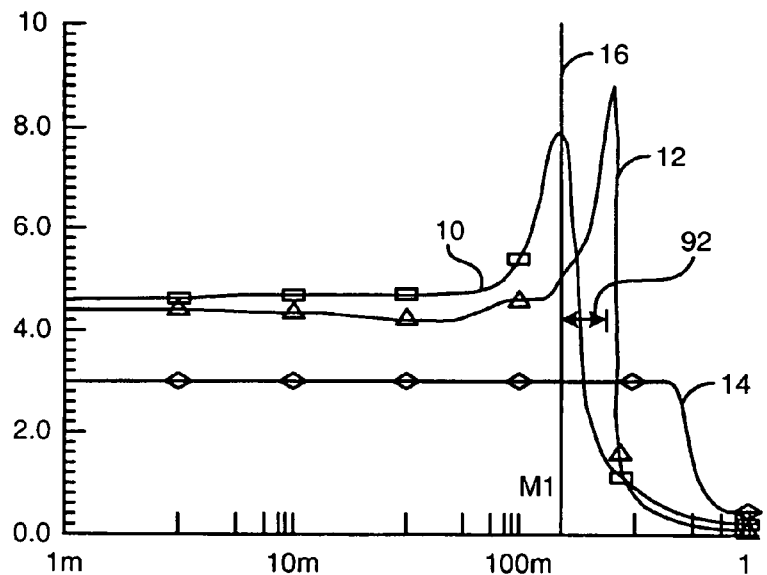
FIG. 1 is a schematic graph showing the group delay characteristics for Butterworth, Gaussian Response and Equiripple filters (horizontal axis-frequency (log); vertical axis-phase)

A further important feature of this embodiment is the configuration of the high frequency boost path to provide the filter with a sharper roll-off characteristic above the passband than that achievable with a conventional equiripple filter without high frequency boost, yet also achieve a substantially flat magnitude response in the passband. As best seen in FIG. 1, the group delay characteristic of a conventional equiripple filter (without high frequency boost) remains substantially constant even to frequencies twice the –3 dB frequency 16. The present embodiment takes advantage of this property by using the high-frequency boost path to extend the passband beyond the usual –3 dB frequency 16. Referring to FIG. 8, the gain of the high frequency boost path is set at 3 dB, so that the overall characteristic is equalized (normalized) at the previous –3 dB frequency, and the new passband 90 extends to approximately twice (about 1.9 times) the original passband frequency (e.g., the effective –3 dB frequency is twice that of the conventional equiripple filter without boost). As a result of the above, when designing the filter poles 72, 74, 76 and 80 for a desired passband, the poles should be chosen as if the equiripple filter were to be used for half the desired passband.

Figure 2:
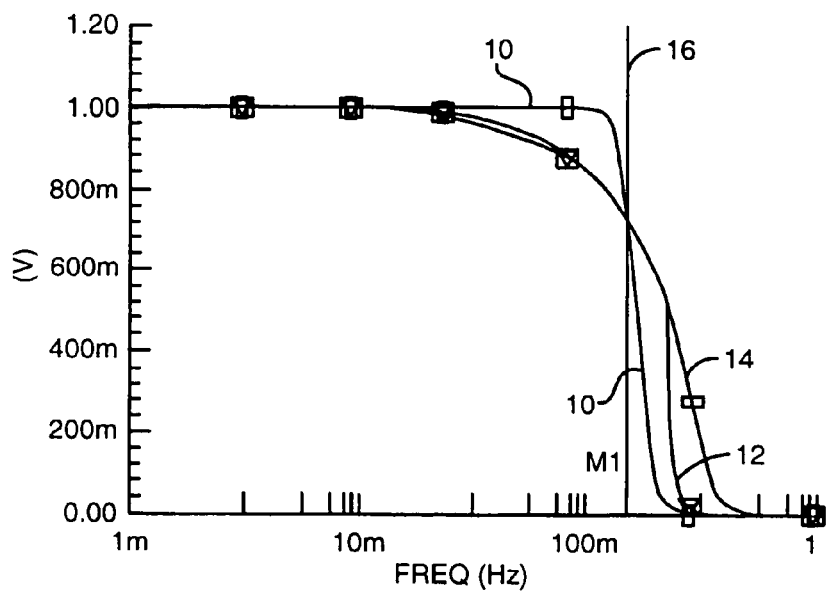
FIG. 2 is a schematic graph showing the magnitude response for the filters of FIG. 1 (horizontal axis-frequency (log); vertical axis-output level)
Figure 3:
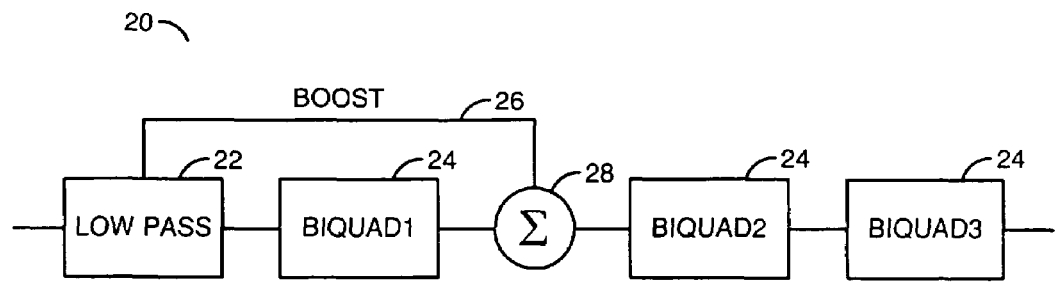
FIG. 3 is a schematic block diagram of a conventional $7^{th}$ order equiripple filter with high frequency boost for data read applications.
Figure 4:
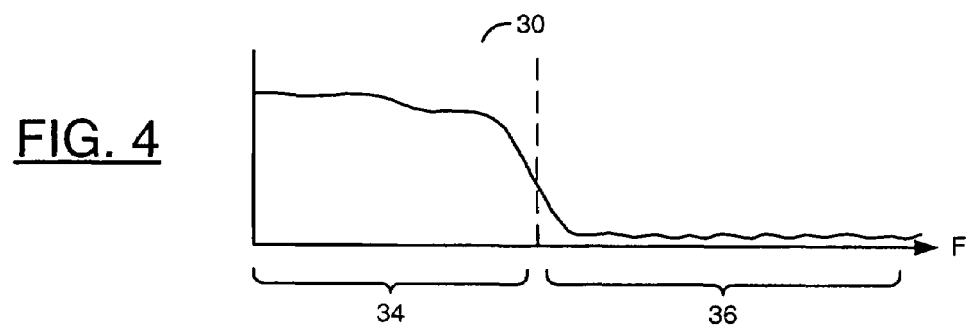
FIG. 4 is a schematic graph showing the spectral content of a conventional data read signal.

As can be seen in FIG. 8, the roll-off characteristic for the filter 70 above the extended passband 90 is very steep, and is considerably steeper than that of the curve 14 (illustrated in FIG. 2). The reason for this is that at the extended frequency 90, the poles 72 and 80 through which the high frequency boost signal still has to pass provide an extremely high level of attenuation, since the frequency is twice the normal –3 dB frequency 16. Therefore, the combination of the equiripple filter operating outside its normal passband and the high frequency boost path being configured to operate outside the normal passband, can provide an equiripple filter with a much steeper roll off characteristic than that compared to FIG. 2. For example, in the present embodiment, the attenuation from the –3 dB frequency to twice this frequency is about 27 dB, which is much greater than the modest attenuation of 11 dB for an equiripple filter without high frequency boost, as discussed above.

In the above embodiment, the frequency at which the high frequency boost peak occurs, and the gain of the high frequency boost path, are fixed in the design of the filter circuit 70. However, it will be appreciated that in other embodiments, one or both of these parameters may be externally controllable or selectable.

Although the principles of the invention have been described with reference to an equiripple filter, the same principles can be applied to any Gaussian family filter, such as a Gaussian response filter or a Bessel filter. A significant feature is that the filter (when considered in a form without high pass boost) should have a group delay which is substantially flat (or only varies within acceptable limits) for an "extended" frequency range above the normal cut-off frequency of the filter. It is this feature which enables the high frequency boost to be used to extend the passband into this extended frequency range. The high frequency boost results in a steeper roll off than for an equivalent filter without the high frequency boost. For the Gaussian response filter curve 12 of FIG. 1, there is a certain extended region 92 in which the group delay remains substantially flat, or has only low variation. A Bessel filter has a group delay characteristic more similar to an Equiripple filter than to a Gaussian response filter, and so has a slightly larger usable extended frequency range about the normal cut-off frequency than a Gaussian response filter.

The type of filter is determined by the relationship between the biquadratic poles of the filter. These can be varied (either by varying the capacitance at each pole or by varying the current though the pole) to achieve the desired category of filter. In the present embodiment, it is preferred that the filter poles be set by varying the capacitance for each pole (rather than using the same capacitance at each pole and controlling instead the current). In an integrated circuit, the capacitors are formed at the same time, and therefore, are very well matched. For example, if the tolerance of the capacitor is ±15%, then each capacitor will be formed with the same tolerance value within that range, leading to excellent matching.

In one form, the filter characteristics in the preferred embodiment may be defined as an nth order roll-off for the first pole 72 (n>1), a pth order roll-off for the third pole 76 (p>0) and a qth order roll-off for the fourth pole 80 (q>0).

Although the invention has been described above in the context of a satellite tuner, it will be appreciated that the invention will find many applications as a filter having a substantially constant group delay with a steep roll-off above the passband.

It will also be appreciated that the foregoing description is merely illustrative of a preferred form of the invention, and that many changes and developments may be included without departing from the principles and/or scope of the invention. Accordingly, it is intended that the appended claims be broadly construed to include such changes and developments.

The invention claimed is:

1. A filter comprising:
    a first pole having a biquadratic low pass characteristic and configured to provide a first low pass signal;
    a second pole coupled to said first low pass signal, said second pole having a first-order low pass characteristic, and providing a second low pass signal and a high pass signal;
    a third pole coupled to said second low pass signal and having a biquadratic low pass characteristic for generating a third low pass signal;
    a signal combiner for combining said third low pass signal and said high pass signal to provide a combined signal; and
    a fourth pole coupled to said combined signal, said fourth pole having a biouadratic low pass characteristic.

2. The filter according to claim 1, wherein said biquadratic characteristic of said first pole corresponds to a first bandpass frequency, said biquadratic characteristic of said third pole corresponds to a third bandpass frequency, and said first bandpass frequency is lower than said third bandpass frequency.

3. The filter according to claim 1, wherein said biquadratic characteristic of said first pole corresponds to a first bandpass frequency, said biquadratic characteristic of said third pole corresponds to a third bandpass frequency, said biquadratic characteristic of said fourth pole corresponds to a fourth bandpass frequency, and said first bandpass frequency is lower than said third and said fourth bandpass frequency.

4. The filter according to claim 1, wherein said high pass signal corresponds to a portion of said first low pass signal rejected by said second pole.

5. The filter according to claim 1, wherein said filter has a frequency related characteristic having (i) a first component defined by an in-line signal path through poles in said filter including said third pole and (ii) a second component defined by a signal path bypassing said third pole, said first component having a roll-off characteristic above a first predetermined frequency, and said second component having a roll-off characteristic above a second predetermined frequency higher than said first predetermined frequency.

6. The filter according to claim 5, wherein said second component is configured to compensate for said roll-off characteristic of said first component above said first predetermined frequency.

7. The filter according to claim 1, wherein the filter is a tuner filter.

8. The filter according to claim 1, wherein said filter is implemented in an integrated circuit.

9. The filter according to claim 1, wherein the filter is an Gaussian family filter.

10. The filter according to claim 9, wherein the filter is an equiripple filter.

11. A filter comprising:
a plurality of filter poles coupled in series; and
a bypass path for bypassing one or more but not all of said filter poles;
wherein said filter has a frequency related characteristic having a first component defined by an in-line signal path through said poles in said filter including said one or more filter poles, and a second component defined by said bypass path,
wherein said first component has a magnitude roll-off characteristic above a first predetermined frequency and a group delay extending to at least a second predetermined frequency higher than said first frequency without peaking,
wherein said second component has a magnitude roll-off characteristic above said second predetermined frequency, said second component being configured to compensate for said magnitude roll-off characteristic of said first component above said first predetermined frequency;
wherein said first and said second components combine to provide a substantially flat magnitude characteristic to said second predetermined frequency.

12. The filter according to claim 11, wherein said filter is a Gaussian family filter.

13. The filter according to claim 12, wherein said filter is an equiripple filter.

14. The filter according to claim 11, wherein said second frequency is about twice the first frequency.

15. A method of filtering a signal comprising the steps of:
(A) biquadratic second order low pass filtering said signal to provide a first signal;
(B) first order low pass filtering said first signal to provide a second signal and a high pass signal;
(C) biquadratic second order low pass filtering said second signal to provide a third signal;
(D) combining said third signal and said high pass signal to provide a fourth signal; and
(E) bicuadratic low pass filtering said combined signal.

16. A filter comprising:
means for biquadratic second order low pass filtering said signal to provide a first signal;
means for first order low pass filtering said first signal to provide a second signal and a high pass signal;
means for biquadratic second order low pass filtering said second signal to provide a third signal;
means for combining said third signal and said high pass signal to provide a fourth signal; and
means for biguadratic low sass filtering said combined signal.

* * * * *